(12) United States Patent
Sarpatwari et al.

(10) Patent No.: US 11,195,998 B2
(45) Date of Patent: *Dec. 7, 2021

(54) MEMORY STRUCTURES HAVING IMPROVED WRITE ENDURANCE

(71) Applicant: Intel Corporation, Santa Clara, CA (US)

(72) Inventors: Karthik Sarpatwari, Meridian, ID (US); Dale Collins, Boise, ID (US); Anna Maria Conti, Agrate Brianza (IT); Fred Daniel Gealy, III, Kuna, ID (US); Andrea Gotti, Vaprio d'Adda (IT); Swapnil Lengade, Boise, ID (US); Stephen Russell, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,555

(22) Filed: Jun. 8, 2020

(65) Prior Publication Data

US 2020/0303642 A1 Sep. 24, 2020

Related U.S. Application Data

(63) Continuation of application No. 16/229,544, filed on Dec. 21, 2018, now Pat. No. 10,680,175.

(51) Int. Cl.
*H01L 45/00* (2006.01)
*G11C 13/00* (2006.01)

(52) U.S. Cl.
CPC ........ *H01L 45/143* (2013.01); *G11C 13/0004* (2013.01); *G11C 13/0007* (2013.01); *H01L 45/1253* (2013.01); *H01L 45/144* (2013.01)

(58) Field of Classification Search
CPC . H01L 45/143; H01L 45/144; H01L 45/1253; H01L 45/1233; G11C 13/0007; G11C 13/0004
See application file for complete search history.

(56) References Cited

U.S. PATENT DOCUMENTS

| 8,084,842 | B2 | 12/2011 | Chen |
| 8,440,990 | B2 | 5/2013 | Wang et al. |
| 9,818,855 | B2 | 11/2017 | Saito et al. |

OTHER PUBLICATIONS

Office Action for U.S. Appl. No. 16/229,544, dated Oct. 17, 2019, 11 pages.

*Primary Examiner* — Allison Bernstein
(74) *Attorney, Agent, or Firm* — Compass IP Law, PC

(57) ABSTRACT

A memory structure can include a memory cell and a first barrier layer having a maximum hydrogen diffusion coefficient of $1 \times 10^{-17}$ cm²/s, said first barrier layer adjacent to the memory cell to minimize contaminant movement to or from the memory cell.

18 Claims, 14 Drawing Sheets

MEMORY STRUCTURES HAVING IMPROVED WRITE ENDURANCE

CLAIM OF PRIORITY

This application is a Continuation of, and claims the benefit of priority of, U.S. application Ser. No. 16/229,544 filed Dec. 21, 2018, which is incorporated herein by reference in its entirety.

BACKGROUND

Non-volatile memory does not require a continuous power supply to retain stored data. The state of a non-volatile memory cell is typically determined by the threshold voltage of the cell. As such, the "programming window" of a memory cell can represent the voltage range within which the threshold voltage of the memory cell can be electrically altered to represent different logic states. The larger the programming window, the easier it can be to detect the difference between logic states. However, over time a memory cell can become less reliable for a number of reasons. For example, as the number of program/erase cycles increases, the programming window can degrade (e.g. decrease) until the memory cell becomes unreliable. As another example, repeated read operations can cause nearby memory cells in the same memory block to change over time and render their data unreliable.

DESCRIPTION OF EMBODIMENTS

Figure 1A:
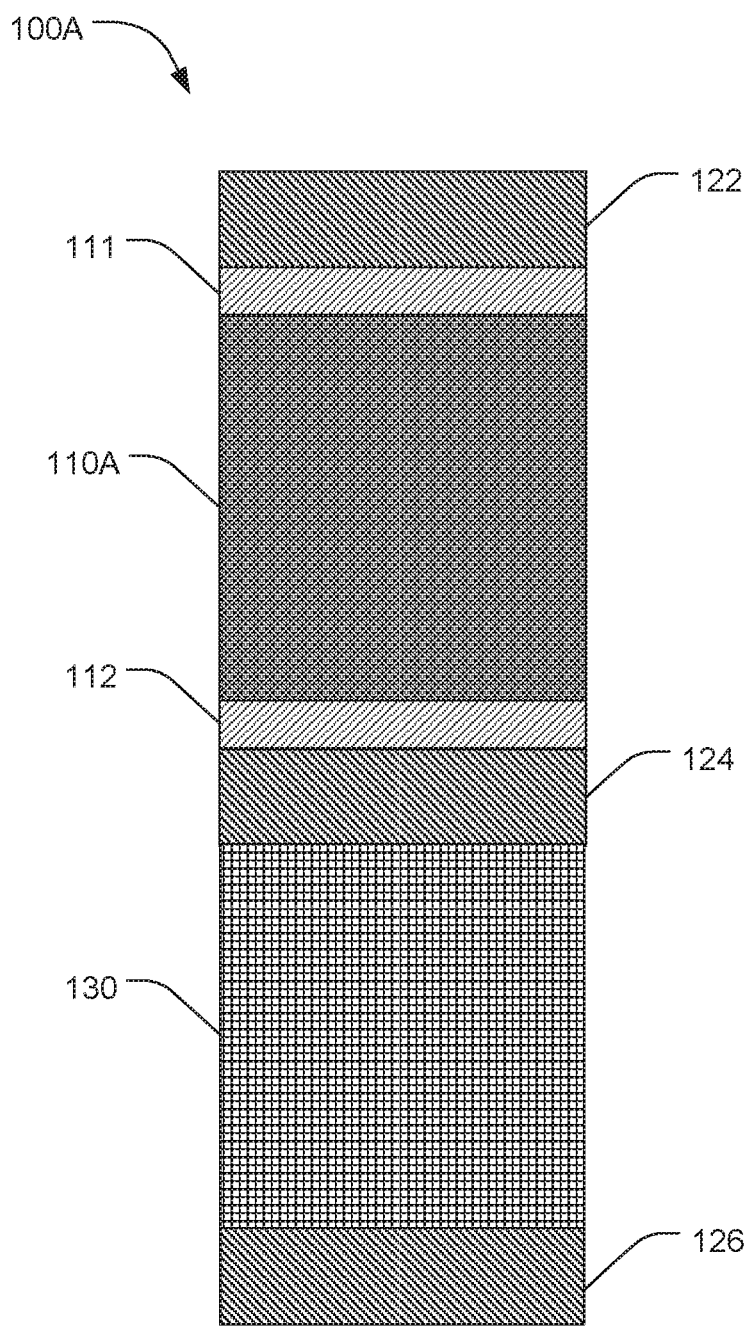
FIG. 1A illustrates a memory cell, in accordance with an example embodiment.

Although the following detailed description contains many specifics for the purpose of illustration, a person of ordinary skill in the art will appreciate that many variations and alterations to the following details can be made and are considered to be included herein. Accordingly, the following embodiments are set forth without any loss of generality to, and without imposing limitations upon, any claims set forth.

It is also to be understood that the terminology used herein is for the purpose of describing particular embodiments only, and is not intended to be limiting. Unless defined otherwise, all technical and scientific terms used herein have the same meaning as commonly understood by one of ordinary skill in the art to which this disclosure belongs.

As used in this written description, the singular forms "a," "an" and "the" include express support for plural referents (and vice versa) unless the context clearly dictates otherwise. Thus, for example, reference to "a memory cell" includes a plurality of such memory cells, and reference to "the bit lines" includes a single bit line.

In this application, "comprises," "comprising," "containing" and "having" and the like can have the meaning ascribed to them in U.S. Patent law and can mean "includes," "including," and the like, and are generally interpreted to be open ended terms. The terms "consisting of" or "consists of" are closed terms, and include only the components, structures, steps, or the like specifically listed in conjunction with such terms, as well as that which is in accordance with U.S. Patent law. "Consisting essentially of" or "consists essentially of" have the meaning generally ascribed to them by U.S. Patent law. In particular, such terms are generally closed terms, with the exception of allowing inclusion of additional items, materials, components, steps, or elements, that do not materially affect the basic and novel characteristics or function of the item(s) used in connection therewith. For example, trace elements present in a composition, but not affecting the compositions nature or characteristics would be permissible if present under the "consisting essentially of" language, even though not expressly recited in a list of items following such terminology. When using an open-ended term, like "comprising" or "including," in this written description it is understood that direct support should be afforded also to "consisting essentially of" language as well as "consisting of" language as if stated explicitly and vice versa.

The terms "first," "second," "third," "fourth," and the like in the description and in the claims, if any, are used for distinguishing between similar elements and not necessarily for describing a particular sequential or chronological order. It is to be understood that any terms so used are interchangeable under appropriate circumstances such that the embodiments described herein are, for example, capable of operation in sequences other than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments described herein are, for example, capable of operation in other orientations than those illustrated or otherwise described herein.

The term "coupled," as used herein, is defined as directly or indirectly connected in an electrical or nonelectrical manner. "Directly coupled" structures or elements are in physical contact with one another and are attached. Objects described herein as being "adjacent to" each other may be in physical contact with each other, in close proximity to each other, or in the same general region or area as each other, as appropriate for the context in which the phrase is used.

Occurrences of the phrase "in one embodiment," or "in one aspect," herein do not necessarily all refer to the same embodiment or aspect.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint. Unless otherwise stated, use of the term "about" in accordance with a specific number or numerical range should also be understood to provide support for such numerical terms or range without the term "about". For example, for the sake of convenience and brevity, a numerical range of "about 50 angstroms to about 80 angstroms" should also be understood to provide support for the range of "50 angstroms to 80 angstroms." Furthermore, it is to be understood that in this specification support for actual numerical values is provided even when the term "about" is used therewith. For example, the recitation of "about" 30 should be construed as not only providing support for values a little above and a little below 30, but also for the actual numerical value of 30 as well.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

Reference throughout this specification to "an example" means that a particular feature, structure, or characteristic described in connection with the example is included in at least one embodiment. Thus, appearances of the phrases "in an example" in various places throughout this specification are not necessarily all referring to the same embodiment.

Example Embodiments

An initial overview of technology embodiments is provided below and specific embodiments are then described in further detail. This initial summary is intended to aid readers in understanding the technological concepts more quickly, but is not intended to identify key or essential features thereof, nor is it intended to limit the scope of the claimed subject matter.

Memory cells are surrounded by a variety of materials to provide both thermal and electrical insulation. However, as the memory cell is cycled during operation, the memory cell and surrounding materials can undergo mechanical deformation and some trace materials (e.g. contaminants) can move from surrounding materials or layers into the memory cell, and vice versa. Over time, this can affect the overall programming window, read/write disturb, and other memory cell properties. For example, movement of trace materials into (or out of) the memory cell can decrease write endurance and increase read/write disturb properties for individual memory cells. The present disclosure describes memory structures, memory devices, computing systems, and associated methods having improved write endurance and decreased read/write disturb properties.

It is also noted that when discussing memory structures, memory devices, computing systems, and associated methods, per se, each individual discussion also applies to each of the other aspects of the present technology. Thus, for example, when discussing memory structures, per se, such discussion also applies to memory devices, computing systems, and associated methods, and vice versa.

In further detail, the memory structures disclosed herein can include a memory cell and a first barrier layer adjacent to the memory cell. The first barrier layer can minimize contaminant movement to or from the memory cell.

Generally, the barrier layers described herein can be used in connection with any suitable non-volatile memory cells, such as chalcogenide-based memory cells (e.g. phase change memory cells and or elements), and other suitable non-volatile memory cells, for example, doped silicon. In traditional phase change memory (PCM) cells, different physical states of the chalcogenide material can have different levels of electrical resistance. For example, one state, such as an amorphous state, can have a high electrical resistance, while another state, such as a crystalline state, can have a low electrical resistance. The different levels of electrical resistance between the amorphous and crystalline states can be used to store memory information (e.g. a plurality of memory states).

In some additional examples, chalcogenide-based memory cells can operate on a somewhat different principle of operation. For example, applying a positive or negative pulse at a particular voltage to the chalcogenide material can cause the threshold voltage of the chalcogenide material to change. For example, in some cases, a particular programming pulse can cause a high voltage threshold state, while an opposite polarity programming pulse can cause a low voltage threshold state. The difference in voltage threshold between these states (e.g. set state and reset state, or vice versa, for example) can be used to store different programmed values and can be defined as a programming window of the chalcogenide-based memory cell. This type of memory material or element can be referred to as a polarity-based memory material or element, or a polarity-based memory cell.

FIG. 1A illustrates one example of a traditional PCM memory cell 100A. The memory cell 100A includes a PCM layer 110A. The PCM layer can include one or more of a variety of materials. As a general matter, the phase change material can include any useful material having a stable and detectable change in phase. In some examples, the phase change material can include germanium, antimony, tellurium, silicon, nickel, gallium, arsenic, silver, tin, gold, lead, bismuth, indium, yttrium, selenium, scandium, boron, oxygen, sulphur, nitrogen, carbon, the like, or a combination thereof. Specific examples of such a materials can include any of a variety of chalcogenide alloys, including, without limitation, Ge—Te, In—Se, Sb—Te, Ge—Sb, Ga—Sb, In—Sb, As—Te, Al—Te, Ge—Sb—Te, Te—Ge—As, In—Sb—Te, In—Se—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among others. The hyphenated chemical composition notation, as used herein, indicates the elements included in a particular mixture or compound, e.g., chalcogenide alloy, and is intended to represent all stoichiometries involving the indicated elements, e.g., $Ge_xSb_y$-$Te_z$ having variations in stoichiometries, such as $Ge_2Sb_2Te_4$, $Ge_2Sb_2Te_7$, $Ge_1Sb_2Te_4$, $Ge_1Sb_4Te_7$, etc., to form a gradient. In some additional examples, the chalcogenide alloy can be doped, such as with indium, yttrium, scandium, boron, nitrogen, oxygen, the like, or a combination thereof.

The PCM memory cell 100A can also include top 111 and bottom 112 lamina layers positioned in direct contact with the PCM layer 110A. These lamina layers can be adhesion layers or can otherwise facilitate a good electrical connection between the PCM layer 110A and surrounding electrode layers (e.g. first electrode 122 and second electrode 124). The lamina layers can be formed of a variety of materials. Non-limiting examples can include tungsten, tantalum, titanium, other refractory metals, refractory metal nitrides, refractory metal silicides, refractory metal carbides, refractory metal borides, the like, or a combination thereof.

In some additional examples, the PCM memory cell 100A can also include a select device (SD) layer 130 including a select device material. It is noted that the select device material is generally made of a chalcogenide material, and as such, the materials described herein with respect to the PCM layer 110A are applicable here as well. The actual material used in a given memory structure for the PCM layer 110A and the SD layer 130 can be different or the same, depending on the design of the memory cell. However, it is noted that the SD layer is typically employed as a switch in a PCM memory cell rather than a memory material. In another example, the select device material in the SD layer 130 can be or include a conductor, semiconductor, or dielectric material. Such materials can be selected as needed to perform an intended function in the memory cell.

In some examples, one or more lamina layers (not shown) can be positioned in direct contact with the SD layer 130. For example, a first lamina layer can be positioned between the SD layer 130 and the PCM layer 110A. In some additional examples, a second lamina layer can be positioned between the SD layer 130 and a third electrode 126. These lamina layers can be adhesion layers or can otherwise facilitate a good electrical connection between the SD layer and surrounding electrode layers (e.g. second electrode 124 and third electrode 126). The lamina layers can be formed of a variety of materials. Non-limiting examples can include tungsten, tantalum, titanium, other refractory metals, refractory metal nitrides, refractory metal silicides, refractory metal carbides, refractory metal borides, the like, or a combination thereof.

In some further examples, the PCM memory cells 100A can also include one or more electrodes (e.g. first electrode 122, second electrode 124, third electrode 126, etc.). The electrodes can include one or more conductive or semiconductive materials. Non-limiting examples can include carbon (C) (e.g. crystalline carbon, amorphous carbon), carbon nitride ($C_xN_y$, where C is typically present in an amount from about 80 atomic percent (at %) to about 99 at % and N is typically present in an amount from about 1 at % to about 20 at %), n-doped polysilicon, p-doped polysilicon, metals (e.g. Al, Cu, Ni, Cr, Co, Ru, Rh, Pd, Ag, Pt, Au, Ir, Ta, and W, for example), conductive metal nitrides, (e.g. TiN, TaN, WN, and TaCN, for example) conductive metal silicides (e.g. tantalum silicides, tungsten silicides, nickel silicides, cobalt silicides, and titanium silicides, for example), conductive metal silicide nitrides (e.g. TiSiN and WSiN, for example), conductive metal carbide nitrides (e.g. TiCN and WCN, for example), conductive metal oxides (e.g. $RuO_2$, for example), the like, or a combination thereof. It is noted that for the various material examples described above, N is typically present in an amount from about 1 at % to about 50 at % and C and Si are typically present in an amount from about 1 at % to about 20%. In some examples, each electrode in the memory cell can include or be formed of the same materials. In other examples, one or more electrodes can include or be formed of different materials. The electrode can have a thickness of from about 5 nm to about 100 nm.

Figure 1B:
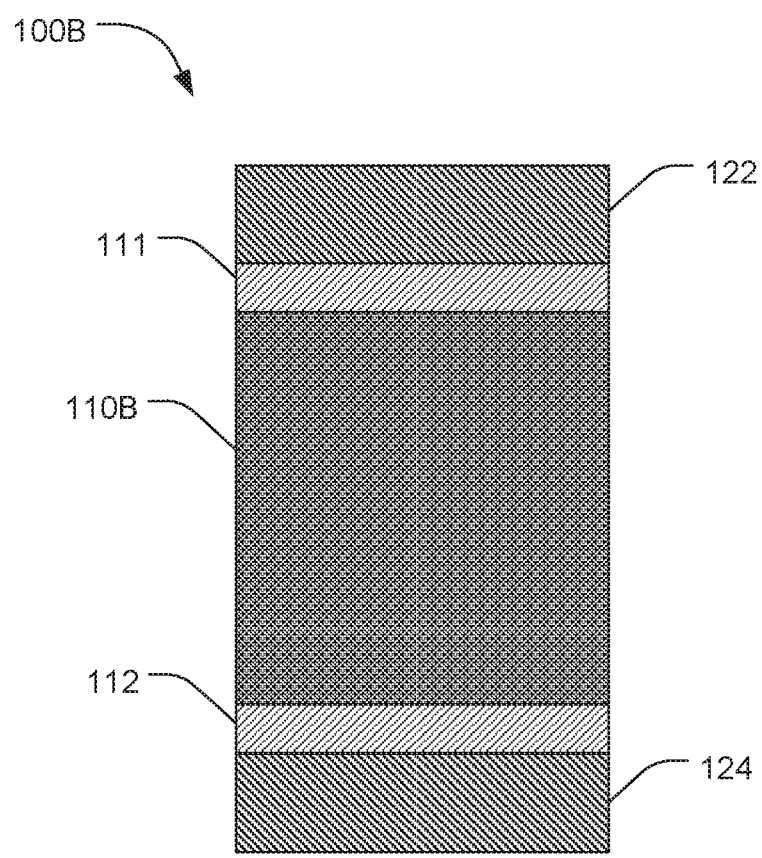
FIG. 1B illustrates another memory cell, in accordance with an example embodiment.

In other examples, the memory cell can include a polarity-based memory cell 100B, as illustrated in FIG. 1B. Where this is the case, the memory cell 100B can include a chalcogenide memory material 110B. A variety of chalcogenide materials can be used. In some examples, the chalcogenide material can include germanium, antimony, tellurium, silicon, nickel, gallium, arsenic, silver, tin, gold, lead, bismuth, indium, selenium, oxygen, sulphur, nitrogen, carbon, yttrium, scandium, the like, or a combination thereof. In some examples, the chalcogenide material can include at least one of selenium (Se), arsenic (As), tellurium (Te), silicon (Si), germanium (Ge), yttrium (Y), indium (In), scandium (Sc), antimony (Sb), or the like. In some additional examples, the chalcogenide material can include Te and/or Se. In some examples, the chalcogenide material can include In, Y, Sc, or a combination thereof. In some specific examples, the chalcogenide material can include Si, Te, Se, As, Ge, or a combination thereof. In some examples, the chalcogenide material can include each of Si, Te, As, and Ge. In some other examples, the chalcogenide material can include each of Si, Se, As, and Ge. In some further examples, the chalcogenide material can include Si, Te, As, Ge, and In. In still other examples, the chalcogenide material can include Si, Te, As, Ge, and Y. In yet other examples, the chalcogenide material can include Si, Te, As, Ge, and P. In additional examples, the chalcogenide material can include Si, Se, As, Ge, and In. In other examples, the chalcogenide material can include Si, Se, As, Ge, and Y. In still other examples, the chalcogenide material can include Si, Se, As, Ge, and P. It is noted that the listed materials can be present in any suitable stoichiometric ratios. In some further examples, the chalcogenide material can be a chalcogenide glass or an amorphous chalcogenide material. Other chalcogenide materials, such as those listed above with respect to the PCM layer 110A can also be used, in some examples.

In some additional examples, the top 111 and bottom lamina layers 112 can also be used in memory cells 100B and can be in direct contact with the chalcogenide memory material 110B. Other aspects of the lamina layers 111, 112 are described above with respect to memory cells 100A.

In still additional examples, one or more electrode layers, such as first electrode 122 and second electrode 124, can also be employed in memory cells 100B. The materials and other aspects of the electrode layers are described above with respect to memory cells 100A.

Turning now to FIGS. 2A-2F, memory structures 201A-201F can include individual memory cells 200 (e.g. as PCM memory cells 100A, polarity-based memory cells 100B, or the like) positioned between an upper conductive channel 240 and a lower conductive channel 242.

The upper 240 and lower 242 conductive channels can be made of a variety of conductive materials. Non-limiting examples can include tungsten (W), copper (Cu), ruthenium (Ru), tungsten nitride (WN), nickel (Ni), tantalum nitride (TaN), platinum (Pt), gold (Au), titanium nitride (TiN), titanium silicon nitride (TiSiN), titanium aluminum nitride (TiAlN), molybdenum nitride (MoN), the like, or a combination thereof. In some examples, the upper and lower conductive channels can comprise the same materials. In some examples, the upper conductive channels can comprise a different material than the lower conductive channels. In other examples, the lower conductive channels can comprise a different material than the upper conductive channels.

Memory structures 201A-201F also include a first barrier layer 250. The first barrier layer 250 can have a maximum hydrogen diffusion coefficient of $1 \times 10^{-17}$ centimeter squared per second ($cm^2/s$). In some additional examples, the first barrier layer can have a maximum hydrogen diffusion coefficient of $5 \times 10^{-18}$ $cm^2/s$. In still additional examples, the first barrier layer can have a maximum hydrogen diffusion coefficient of $1 \times 10^{-18}$ $cm^2/s$. In some examples, the first barrier layer can have a hydrogen diffusion coefficient of from about $1 \times 10^{-17}$ $cm^2/s$ to about $1 \times 10^{-19}$ $cm^2/s$ or $1 \times 10^{-20}$ $cm^2/s$.

Generally, the first barrier layer can have a thickness of from 10s of nanometers to 100s of nanometers. In some specific examples, the first barrier layer can have a thickness of from about 10 nm to about 200 nm or 300 nm. In other examples, the first barrier layer can have a thickness of from about 20 or 30 nm to about 100 nm.

A variety of suitable materials can be used to form the first barrier layer. In some specific examples, the first barrier layer can include a metal nitride, a metal oxide, a metal carbide, the like, or a combination thereof. As used herein, the term "metal" refers to basic metals (e.g. aluminum, gallium, indium, tin, thallium, lead, bismuth, etc.), transition metals (e.g. scandium, titanium, vanadium, chromium, manganese, iron, cobalt, nickel, copper, zinc, yttrium, zirconium, niobium, molybdenum, technetium, ruthenium, rhodium, palladium, silver, cadmium, lanthanum, hafnium, tantalum, tungsten, rhenium, osmium, iridium, platinum, gold, etc.), metalloids (e.g. boron, silicon, germanium, arsenic, antimony, tellurium, polonium, tennessine, etc.), or other suitable metals. With this in mind, non-limiting examples of suitable materials for use in forming the first barrier layer can include silicon nitride, aluminum oxide, hafnium oxide, zirconium oxide, niobium oxide, titanium oxide, silicon carbide, the like, or a combination thereof. Generally, metals can be present in the first barrier layer in an amount from about 20 at % to about 60 at %, nitrogen (where present) can be present in the first barrier layer in an amount from about 35 at % to about 65 at %, carbon (where present) can be present in the first barrier layer in an amount from about 35 at % to about 65 at %, and oxygen (where present) can be present in the first barrier layer in an amount from about 30 at % to about 80 at %. In some specific examples, where the first barrier layer includes silicon nitride, N can be present in an amount of from about 40 at % to about 60 at %, or about 50 at %. In some additional examples, where the first barrier layer includes aluminum oxide, aluminum can be present in an amount of from about 30 at % to about 50 at %, or about 40 at %. In some other examples, where the first barrier layer includes hafnium oxide, hafnium can be present in an amount from about 20 at % to about 40 at %. In yet other examples, where the first barrier layer includes zirconium oxide, zirconium can be present in an amount from about 20 at % to about 40 at %. In some further examples, where the first barrier layer includes niobium oxide, niobium can be present in an amount from about 20 at % to about 40 at %. In still other examples, where the first barrier layer includes titanium oxide, titanium can be present in an amount from about 20 at % to about 50 at %. In yet further examples, where the first barrier layer includes silicon carbide, silicon can be present in an amount from about 40 at % to about 60 at %.

In some further examples, the first barrier layer can include an additional dopant to modify (e.g. decrease) the diffusivity of a particular contaminant through the barrier layer. Thus, in some examples, the first barrier layer can include doped silicon nitride, doped aluminum oxide, doped hafnium oxide, doped zirconium oxide, doped niobium oxide, doped titanium oxide, doped silicon carbide, the like, or a combination thereof. Various suitable dopants can be employed for a given application. Non-limiting examples of dopants can include silicon, zirconium, hafnium, niobium, titanium, carbon, the like, or a combination thereof. Where the first barrier layer includes a dopant, the dopant can typically be present in an amount from 0.1 at % to 10 at %.

Figure 2A:
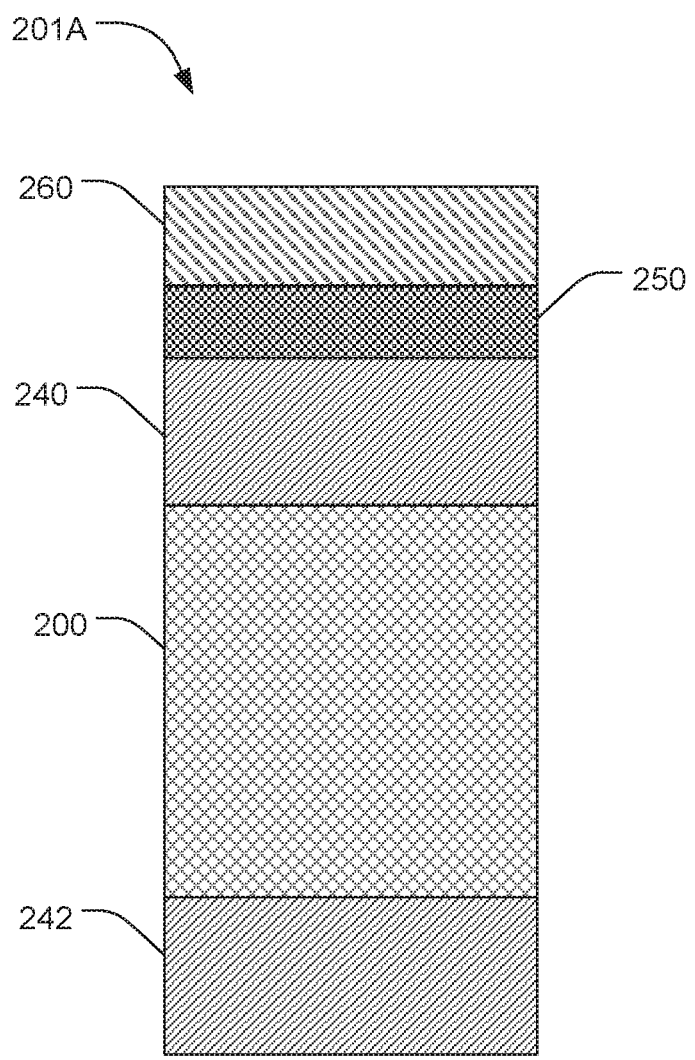
FIG. 2A illustrates a memory structure, in accordance with an example embodiment.

As illustrated in FIGS. 2A-2F, the first barrier layer can be positioned in a variety of locations relative to the memory cell 200. For example, as illustrated in FIG. 2A, memory structure 201A includes a first barrier layer 250 positioned between a first passivation layer 260 and the memory cell 200 in direct contact with the upper conductive channel 240.

The first passivation layer 260 can be made of a variety of suitable passivation materials. In some examples, the first passivation layer can include or be formed of an encapsulant, such as oxynitride, a plastic material, such as polyimide, or the like, that can seal the memory cell against moisture or other external elements that can cause deterioration and degradation of performance.

Figure 2B:
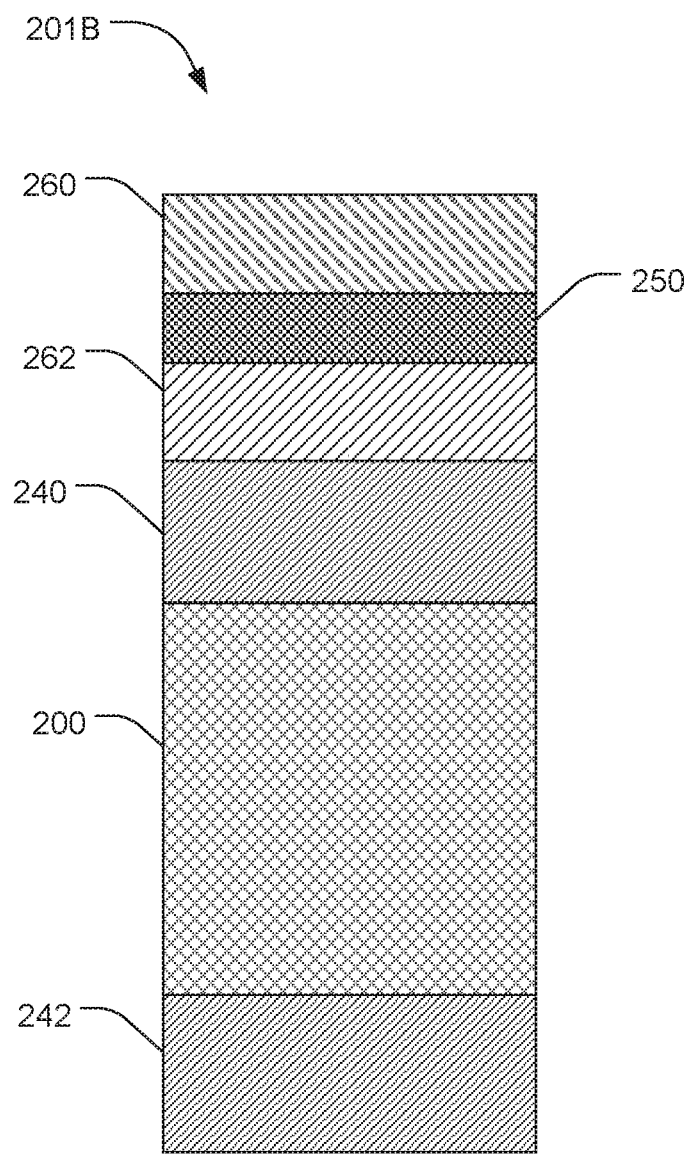
FIG. 2B illustrates another memory structure, in accordance with an example embodiment.

FIG. 2B illustrates the first barrier layer 250 positioned between a first passivation layer 260 and a second passivation layer 262. The second passivation layer can also be made of a variety of suitable passivation materials. In some examples, the second passivation layer can include or be formed of an encapsulant, such as oxynitride, a plastic material, such as polyimide, or the like, that can seal the memory cell against moisture or other external elements that can cause deterioration and degradation of performance. The passivation material can be formed using spin deposition techniques, CVD, PVD, ALD, the like, or a combination thereof. In some examples, the first passivation layer 260 and the second passivation layer 262 can include or be formed of the same materials. In other examples, the first passivation layer 260 and the second passivation layer 262 can include or be formed of different materials. In some specific examples, the first passivation layer 260 can include or be formed of a plastic material, such as polyimide, and the second passivation layer 262 can include or be formed of an encapsulant, such as oxynitride, aluminum oxide, silicon carbide, other high-k dielectrics, or a combination thereof. In some examples, the first passivation layer can have a thickness of from about 10 nm to about 100 nm. In some additional examples, the second passivation layer can have a thickness of from about 10 nm to about 100 nm.

Figure 2C:
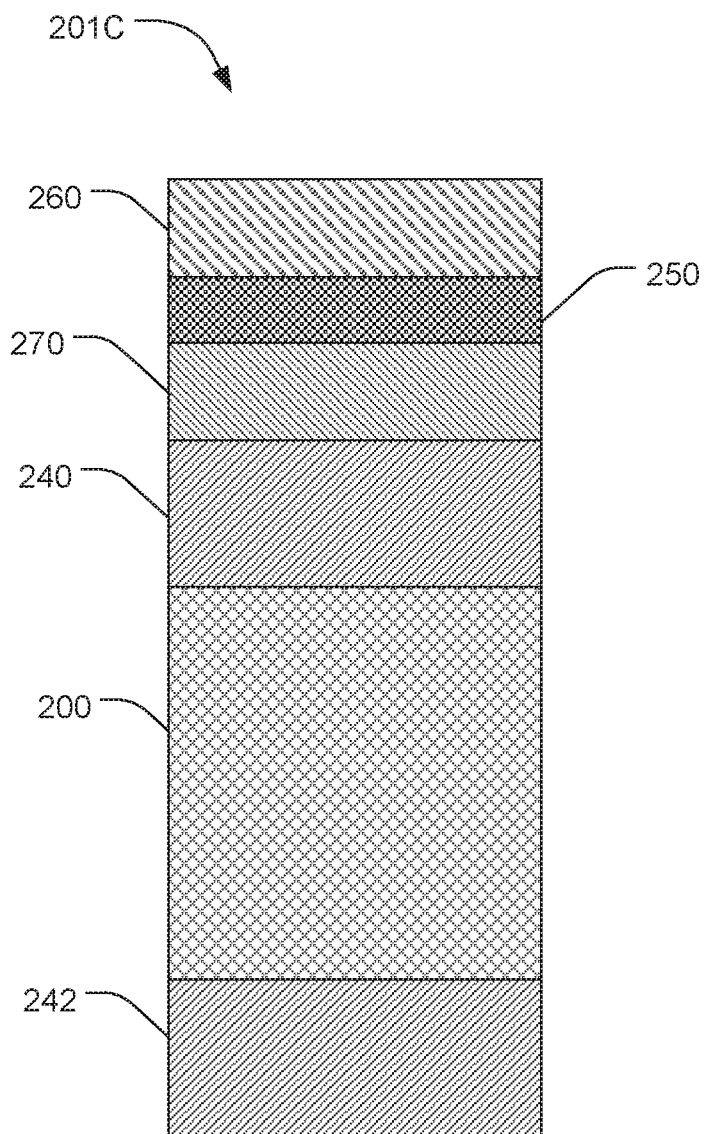
FIG. 2C illustrates another memory structure, in accordance with an example embodiment.
Figure 2D:
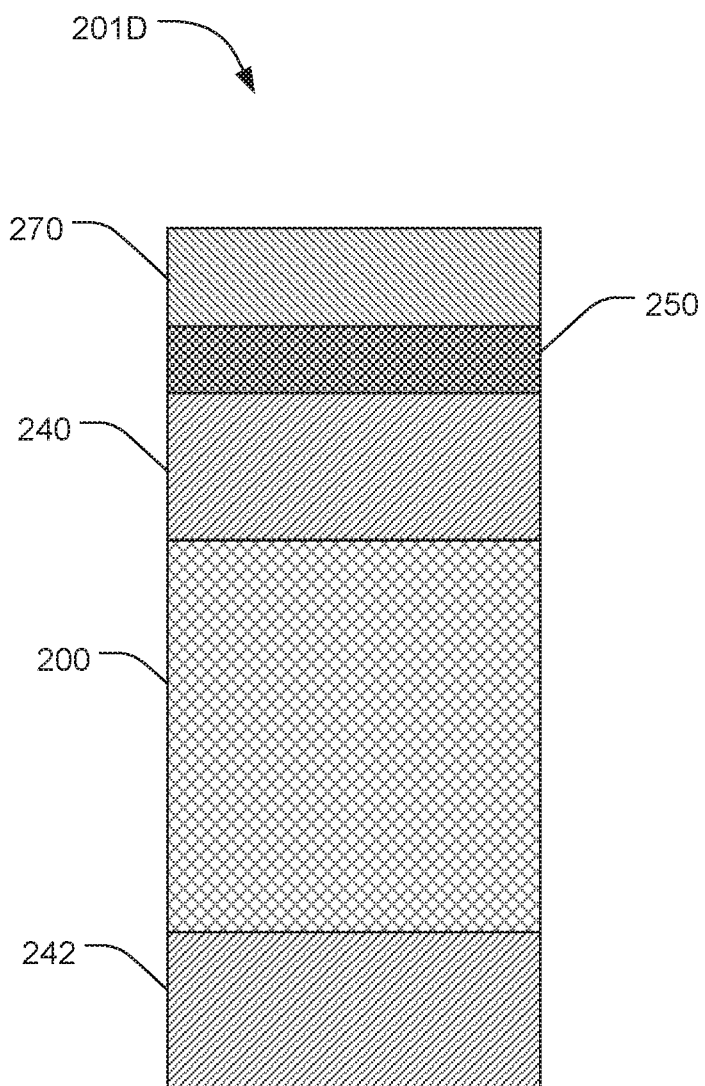
FIG. 2D illustrates another memory structure, in accordance with an example embodiment.
Figure 2E:
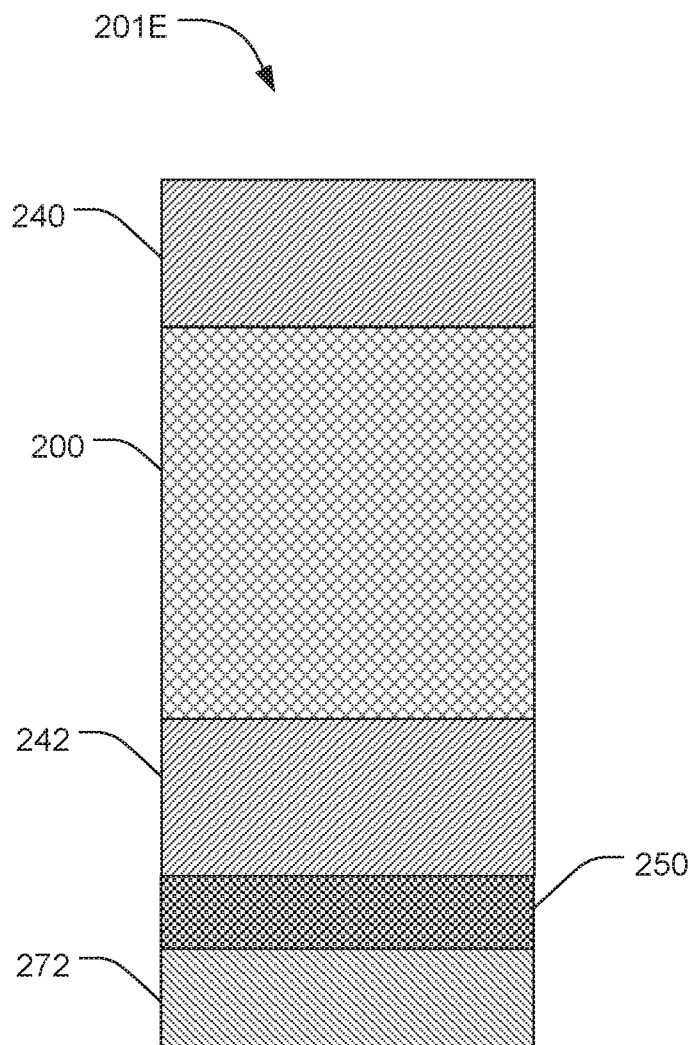
FIG. 2E illustrates another memory structure, in accordance with an example embodiment.

As illustrated in FIG. 2C, memory structure 201C includes a first barrier layer 250 positioned between a first passivation layer 260 (or a second passivation layer, for example) and a tetraethyl orthosilicate (TEOS) layer. Alternatively, FIG. 2D illustrates memory structure 201D with a first barrier layer 250 positioned between the TEOS layer and the memory cell 200. Further, while FIGS. 2A-2D each illustrate the first barrier layer 250 positioned on the memory cell 200, FIG. 2E illustrates a memory structure 201E having a first barrier layer 250 positioned between the memory cell 100 and a second TEOS layer 272, but beneath the memory cell 200. Thus, FIGS. 2A-2E illustrate a variety of non-limiting locations where the first barrier layer 250 can be positioned relative to the memory cell 200.

Figure 2F:
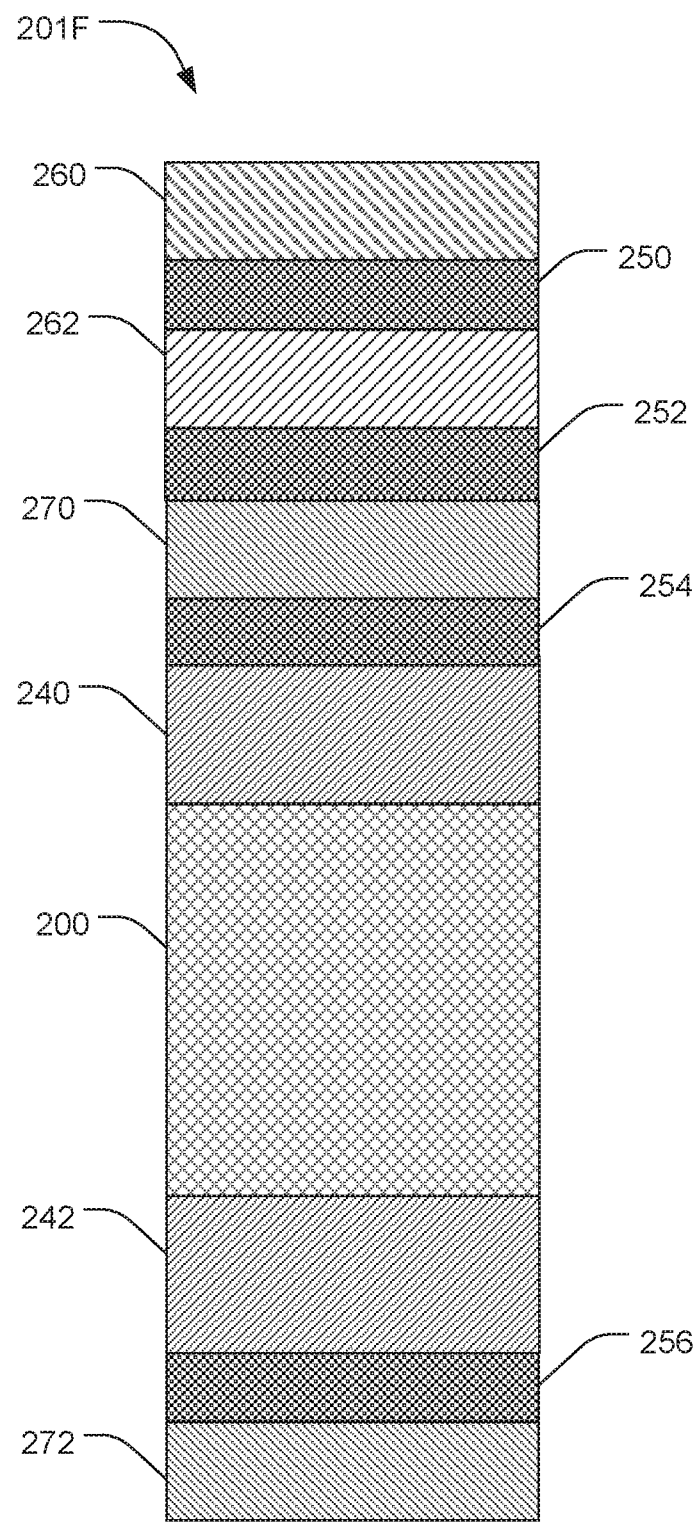
FIG. 2F illustrates another memory structure, in accordance with an example embodiment.

Further, FIG. 2F illustrates memory structure 201F having a plurality of barrier layers 250, 252, 254, 256. More specifically, first barrier layer 250 is positioned between first passivation layer 260 and second passivation layer 262, second barrier layer 252 is positioned between second passivation layer 262 and TEOS layer 270, third barrier layer 254 is positioned between TEOS layer 270 and the upper conductive channel 240 above the memory cell 100, and the fourth barrier layer 256 is positioned between the second TEOS layer 272 and the lower conductive channel 242 below the memory cell 200. It is noted that this is one non-limiting example of a memory structure including a plurality of barrier layers. In other examples, memory structure 201F can include barrier layer 250 alone, or in combination with one or more of barrier layers 252, 254, and 256. In still other examples, memory structure 201F can include barrier layer 252 alone, or in combination with one or more of barrier layers 250, 254, and 256. In additional examples, memory structure 201F can include barrier layer 254 alone, or in combination with one or more of barrier layers 250, 252, and 256. In yet other examples, memory structure 201F can include barrier layer 256 alone, or in combination with one or more of barrier layers 250, 252, and 254. In some specific examples, the memory structure includes barrier layers 250, 252, and 256. In other specific examples, the memory device includes barrier layer 250. In still other specific examples, the memory device includes barrier layers 250, 252. In yet other specific examples, the memory device includes barrier layers 252, 254.

The present disclosure also describes memory devices. A memory device can include a plurality of memory cells as described herein. A first barrier layer, as described herein, can be positioned adjacent to the plurality of memory cells to minimize contaminant movement to or from the plurality of memory cells. The plurality of memory cells can be oriented along a common conductive channel, such as an upper conductive channel or a lower conductive channel. Individual memory cells of the plurality of memory cells can be positioned between respective upper and lower conductive channels.

Figure 3:
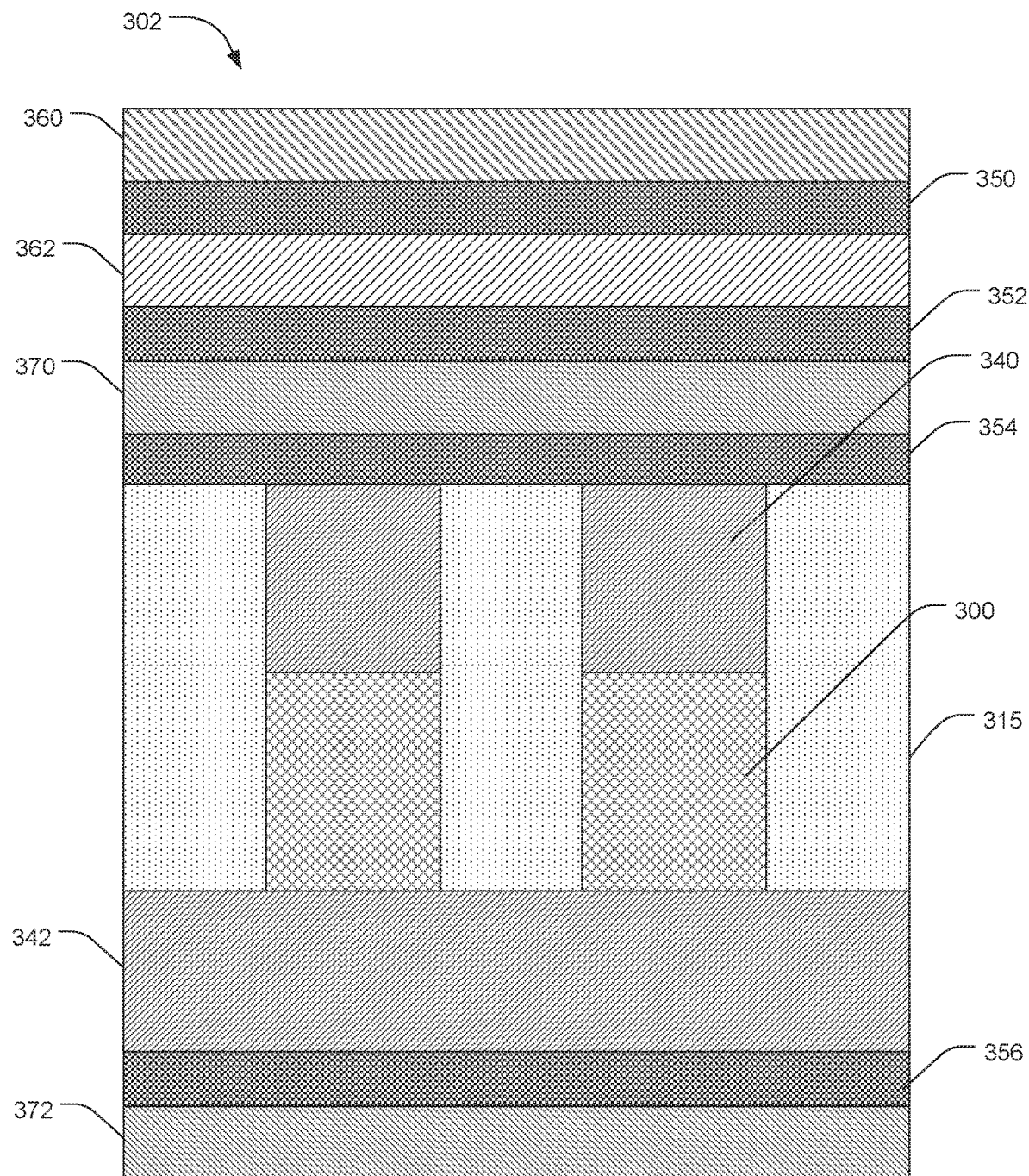
FIG. 3 illustrates a memory device, in accordance with an example embodiment.

One non-limiting example of a memory device 302 is illustrated in FIG. 3. The memory device 302 can include a plurality of memory cells 300 (e.g. phase change memory cell 100A, polarity-based memory cell 100B, etc.) oriented along a common conductive channel. In this particular example, the common conductive channel is the lower conductive channel 342 (e.g. a wordline, for example). However, in other examples, the common conductive channel can be an upper conductive channel 340 (e.g. a bitline, for example). Individual memory cells can be electrically insulated from one another using dielectric material 315. A variety of dielectric materials 315 can be used to electrically insulate individual memory cells 300. In some examples, the dielectric material 315 can include silicon oxide, silicon nitride, silicon oxy-carbide, spin-on-glass, organic polymer, organic/inorganic co-polymer, or other suitable dielectric material.

In this particular example, the memory device 302 includes a plurality of barrier layers 350, 352, 354, 356. More specifically, memory device 302 includes a first barrier layer 350 positioned between a first passivation layer 360 and a second passivation layer 362, a second barrier layer 352 positioned between the second passivation layer 362 and a TEOS layer 370, a third barrier layer 354 positioned between the TEOS layer 370 and the plurality of memory cells 100 (or plurality of upper conductive channels 340), and a fourth barrier layer 356 positioned between second or lower TEOS layer 372 and the plurality of memory cells 100. It is noted that from 1 to 3 of barrier layers 350, 352, 354, and 356 can be withheld from memory device 302 in any combination. Thus, in some examples, the memory device can include barrier layer 350 alone or in combination with one or more of barrier layers 352, 354, and 356. In other examples, the memory device can include barrier layer 352 alone or in combination with one or more of barrier layers 350, 354, and 356. In additional examples, the memory device can include barrier layer 354 alone or in combination with one or more of barrier layers 350, 352, and 356. In still other examples, the memory device can include barrier layer 356 alone or in combination with one or more of barrier layers 350, 352, and 354. In some specific examples, the memory device includes barrier layers 350, 352, and 356. In other specific examples, the memory device includes barrier layer 350. In still other specific examples, the memory device includes barrier layers 350, 352. In yet other specific examples, the memory device includes barrier layers 352, 354.

Figure 4:
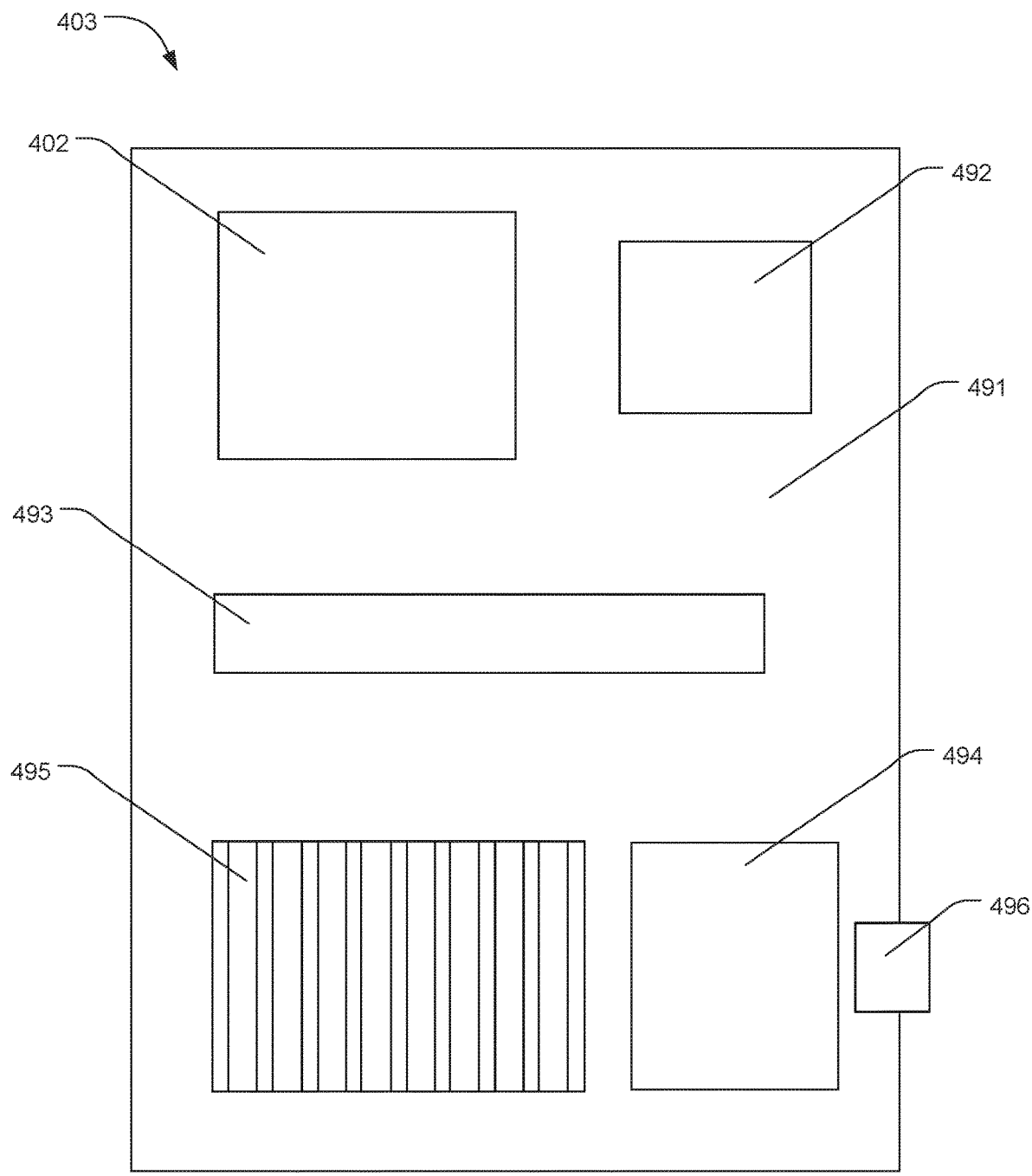
FIG. 4 illustrates a computing system, in accordance with an example embodiment.

In some examples, a memory device as described herein can be included in a computing system. As illustrated in FIG. 4, computing system 403 can include a motherboard 491 and a memory device 402, as described herein, that is operably coupled to the motherboard 491. In one aspect, a computing system 403 can also include a processor 492, an additional memory device 493, a radio 494, a heat sink 495, a port 496, a slot, or any other suitable device or component, which can be operably coupled to the motherboard 491. The computing system 403 can comprise any type of computing system, such as a desktop computer, a laptop computer, a tablet computer, a smartphone, a wearable device, a server (e.g. a local data server, a cloud server, or the like), etc. Other embodiments need not include all of the features specified in FIG. 4, and may include alternative features not specified in FIG. 4.

Circuitry used in electronic components or devices (e.g. a die) of a computing system can include hardware, firmware, program code, executable code, computer instructions, and/or software. Electronic components and devices can include a non-transitory computer readable storage medium which can be a computer readable storage medium that does not include signal. In the case of program code execution on programmable computers, the computing systems recited herein may include a processor, a storage medium readable by the processor (including volatile and non-volatile memory and/or storage elements), at least one input device, and at least one output device. Volatile and non-volatile memory and/or storage elements may be a RAM, EPROM, flash drive, optical drive, magnetic hard drive, solid state drive, or other medium for storing electronic data. Node and wireless devices may also include a transceiver module, a counter module, a processing module, and/or a clock module or timer module. One or more programs that may implement or utilize any techniques described herein may use an application programming interface (API), reusable controls, and the like. Such programs may be implemented in a high level procedural or object-oriented programming language to communicate with a computer system. However, the program(s) may be implemented in assembly or machine language, if desired. In any case, the language may be a compiled or interpreted language, and combined with hardware implementations.

The present disclosure also describes a method of prolonging write endurance of a memory cell, memory structure, or memory device and a method of decreasing read disturb properties of a memory cell, memory structure, or memory device. The method can include positioning a first barrier layer adjacent to a memory cell to minimize contaminant movement to or from the memory cell.

As described above, some trace materials (e.g. contaminants) can move from surrounding materials or layers into the memory cell, and vice versa, during operation of the memory cell. Over time, this can affect the overall programming window, read/write disturb, and other memory cell properties. For example, movement of trace materials into (or out of) the memory cell can decrease write endurance and increase read/write disturb properties for individual memory cells. However, incorporating a barrier layer (e.g. a contaminant barrier) that minimizes hydrogen movement and movement of other contaminants or trace particles or materials into and out of the memory cell, as described herein, can help prolong the write endurance of the memory cell and can decrease the read/write disturb properties of the memory cells.

These methods are described in connection with a method of manufacturing a memory structure or memory device. The method can include forming one or more memory cells as described herein and positioning a barrier layer adjacent to the memory cell or plurality of memory cells to minimize contaminant movement to or from the memory cell or plurality of memory cells.

Figure 5A:
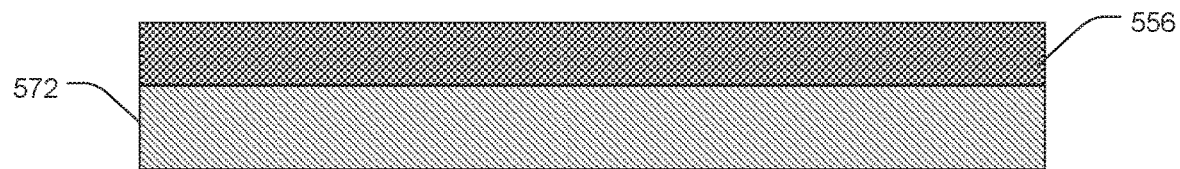
FIG. 5A illustrates a memory device at one stage of manufacturing, in accordance with an example embodiment.

FIGS. 5A-5E illustrate one non-limiting example of a method of manufacturing a memory device. As illustrated in FIG. 5A, a first barrier layer 556 can be formed on a lower TEOS layer 572. The first barrier layer can be formed using chemical vapor deposition (CVD), physical vapor deposition (PVD), atomic layer deposition (ALD), or the like.

Figure 5B:
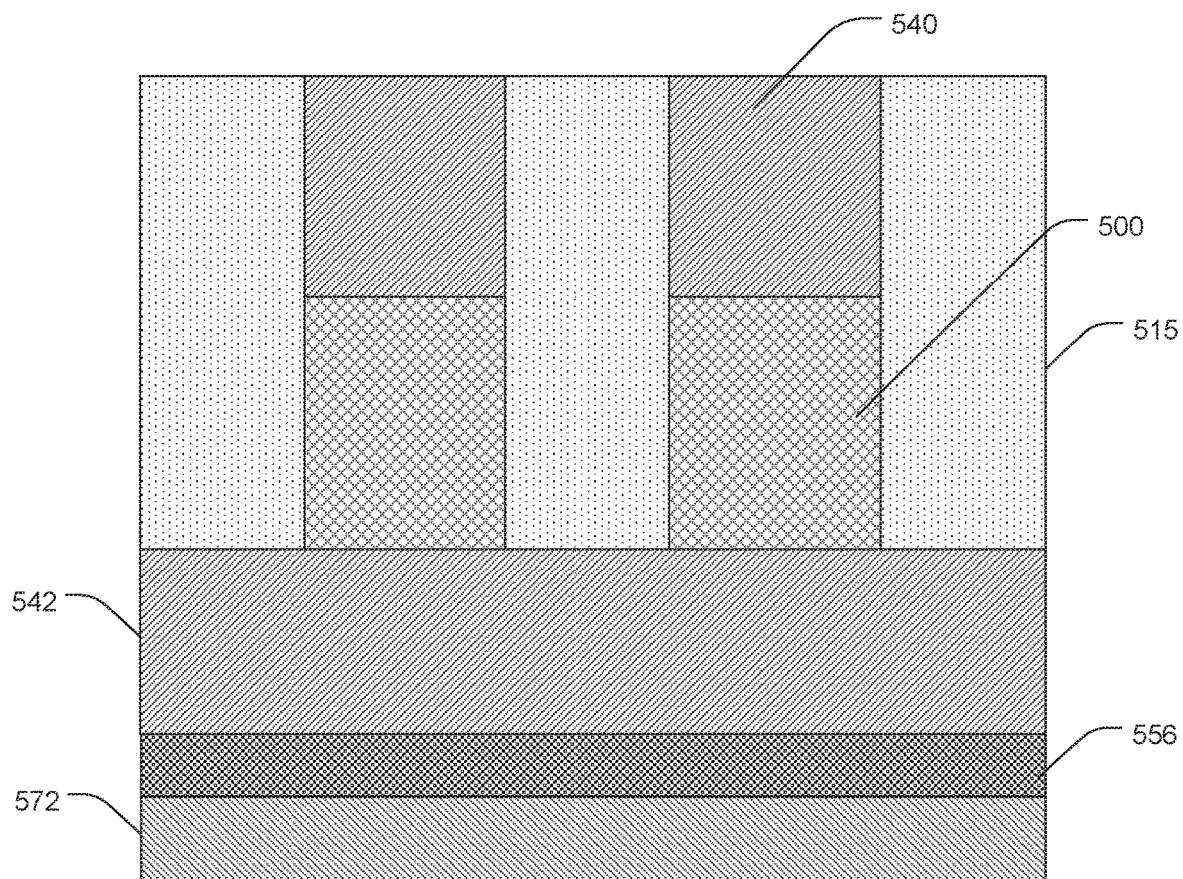
FIG. 5B illustrates a memory device at one stage of manufacturing, in accordance with an example embodiment.

As illustrated in FIG. 5B, a lower conductive channel 542 can be formed on the first barrier layer 556. A plurality of memory cells 500 can be formed along the lower conductive channel 542 and a plurality of upper conductive channels 540 can be formed on the plurality of memory cells 100. Individual memory cells can be electrically isolated from one another by dielectric material 515. The first barrier layer 556 can help minimize or prevent hydrogen movement and other contaminant movement into and out of the memory cells 500 across first barrier layer 556 (e.g. to or from lower TEOS layer 572 or other layers beneath the lower TEOS layer 572, for example).

Figure 5C:
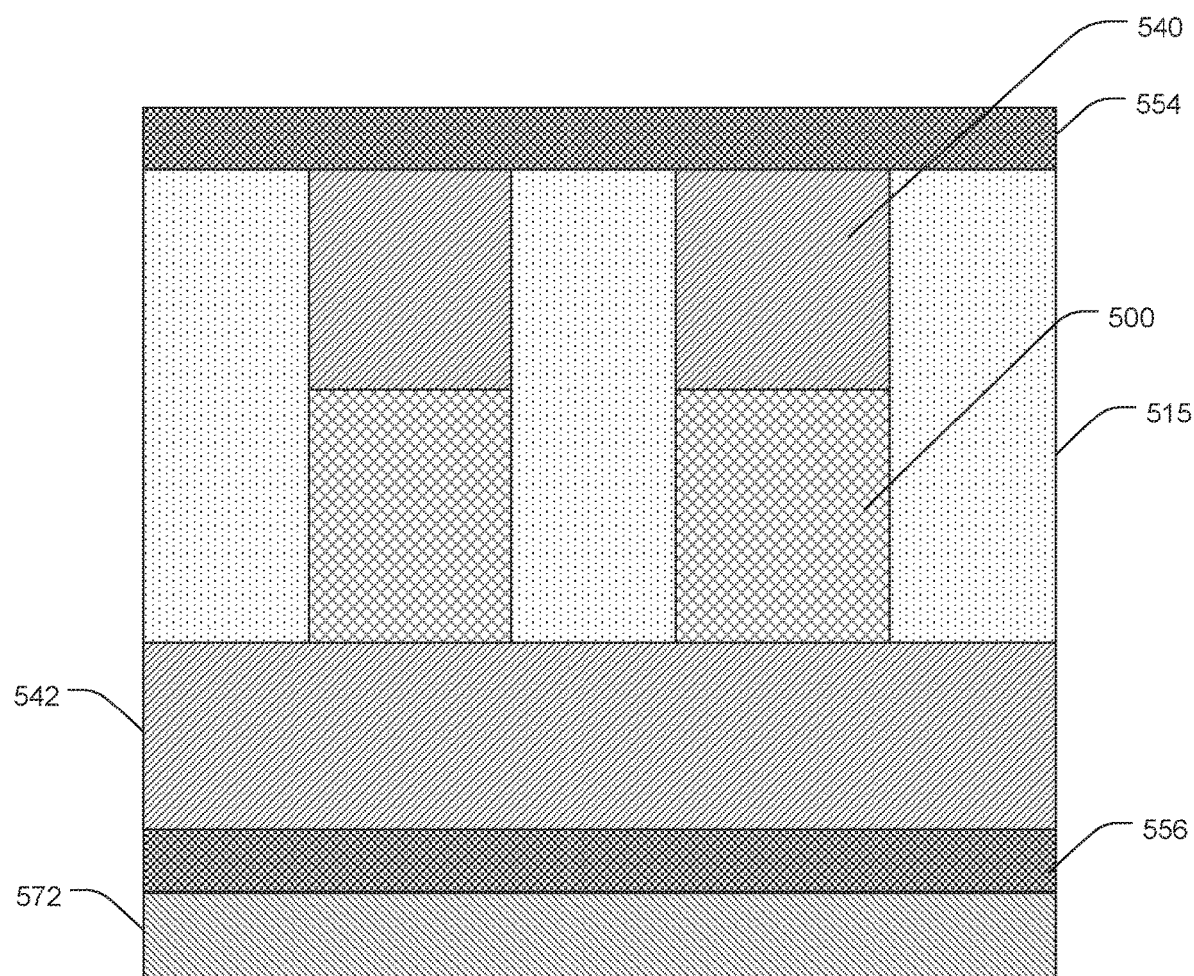
FIG. 5C illustrates a memory device at one stage of manufacturing, in accordance with an example embodiment.

Turning to FIG. 5C, a second barrier layer 554 can be formed on the plurality of memory cells. The second barrier layer 554 can help minimize or prevent hydrogen movement and other contaminant movement into and out of the memory cells 500 across second barrier layer 554 (e.g. to or from any layers formed on the second barrier layer 554, for example).

Figure 5D:
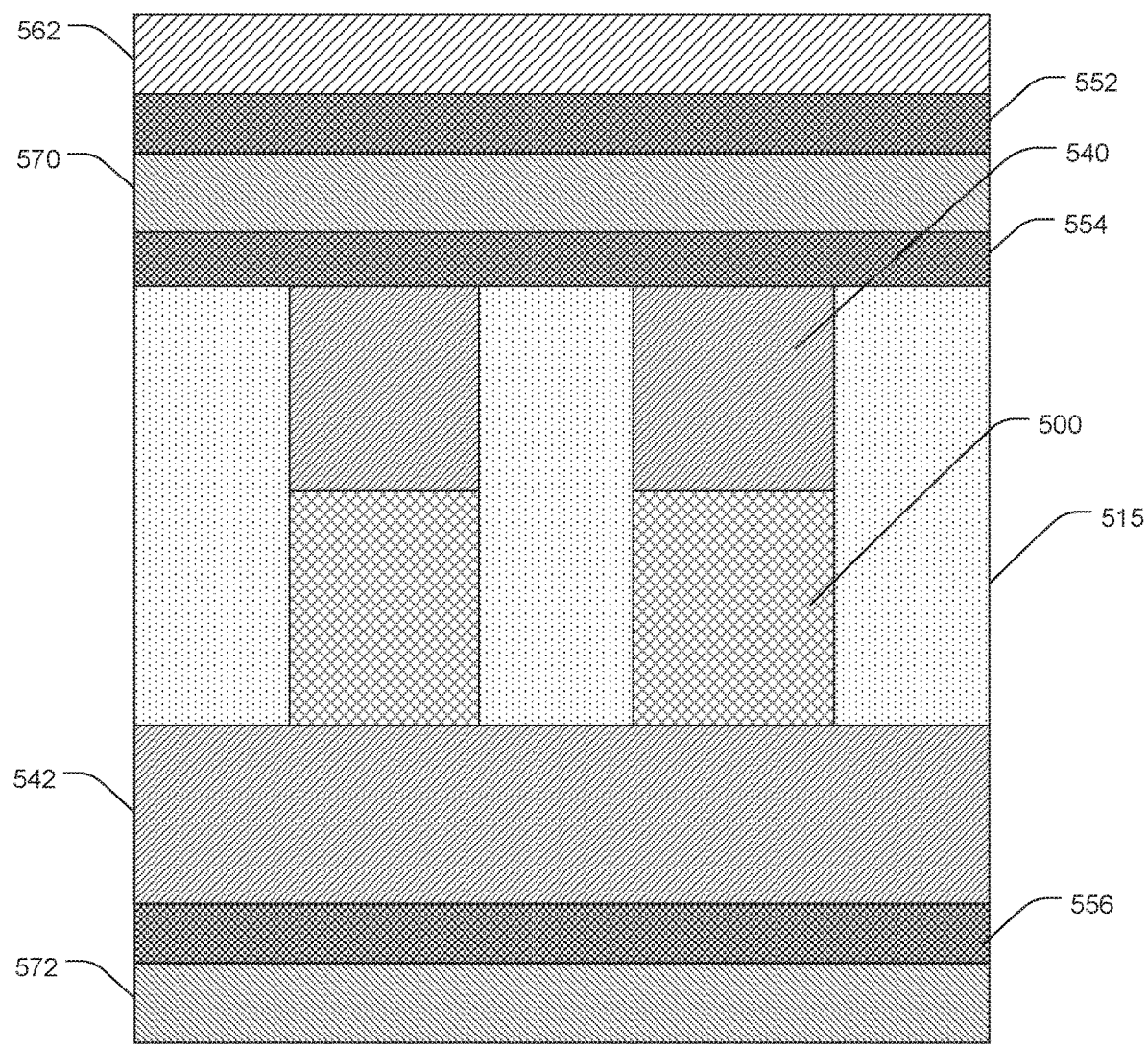
FIG. 5D illustrates a memory device at one stage of manufacturing, in accordance with an example embodiment.
Figure 5E:
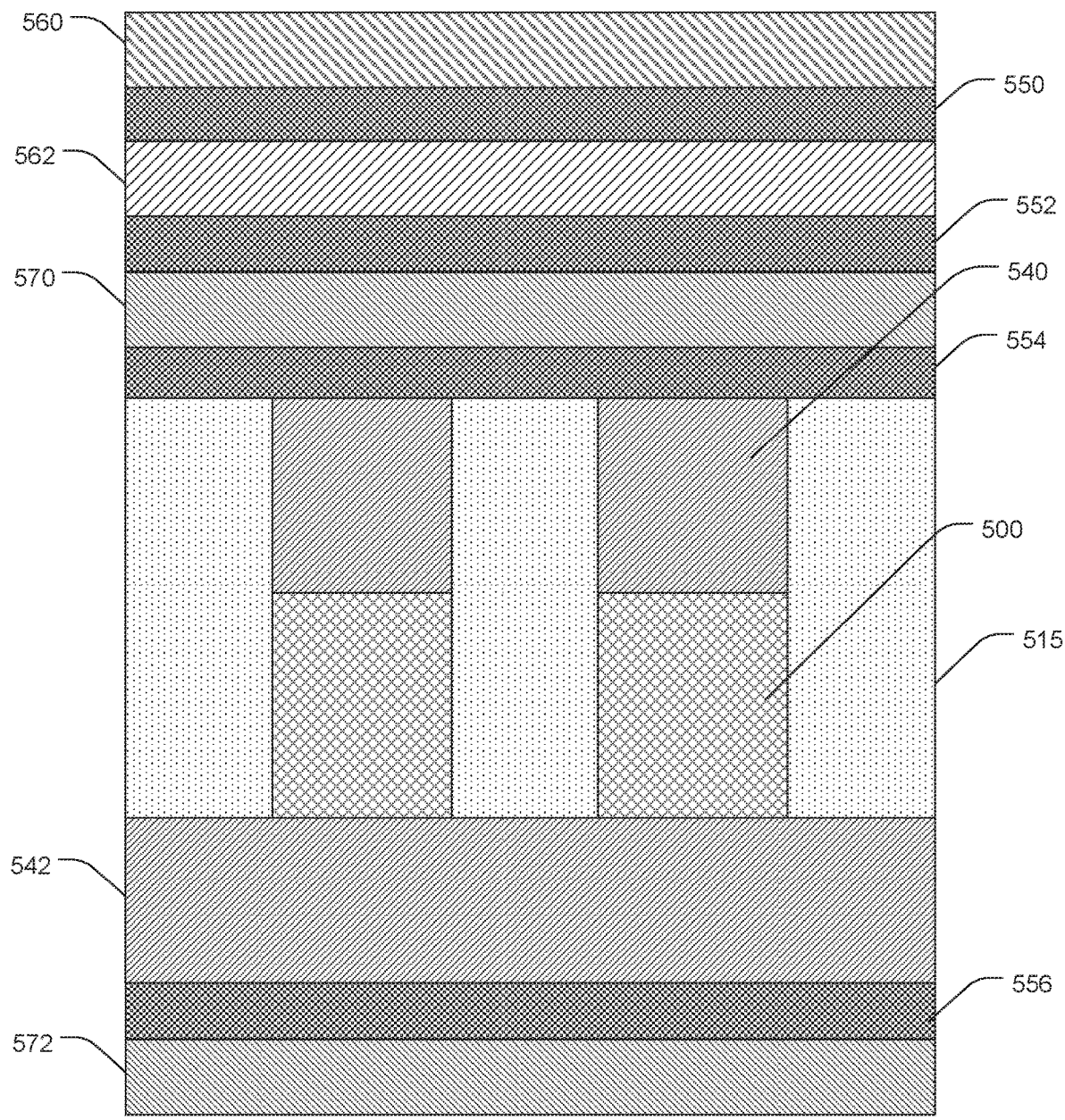
FIG. 5E illustrates a memory device at one stage of manufacturing, in accordance with an example embodiment.

An upper TEOS layer 570, a third barrier layer 552, and a lower passivation layer (e.g. second passivation layer) 562 can be formed on the second barrier layer 554, as illustrated in FIG. 5D. The third barrier layer 552 can minimize or prevent hydrogen movement and other contaminant movement into and out of the memory cells 500 across third barrier layer 552 (e.g. to or from lower passivation layer 562 or other layers above the lower passivation layer 562, for example). Similarly, the second barrier layer 554 can minimize or prevent hydrogen movement and other contaminant movement to or from TEOS layer 570 or other layers above the TEOS layer 570, for example.

A fourth barrier layer 550 can be formed on the lower passivation layer 562 and an upper passivation layer (e.g. a first passivation layer) 560 can be formed on the fourth barrier layer 550. The fourth barrier layer 550 can minimize or prevent hydrogen movement and other contaminant movement into and out of the memory cells 500 across fourth barrier layer 550 (e.g. from upper passivation layer 560 or other layers above the upper passivation layer 560, for example).

Individual layers described in the present methods of manufacturing can be formed using spin deposition techniques, chemical vapor deposition (CVD), physical vapor deposition (PVD), atomic layer deposition (ALD), the like, or a combination thereof. It is again noted that from 1 to 3 of barrier layers 550, 552, 554, and 556 illustrated in FIGS. 5A-5E can be withheld from the memory device. Thus, in some examples, one of barrier layers 550, 552, 554, and 556 can be included in the memory device. In other examples, two of barrier layers 550, 552, 554, and 556 can be included in the memory device. In still other examples, three of barrier layers 550, 552, 554, and 556 can be included in the memory device. In yet additional examples, each of barrier layers 550, 552, 554, and 556 can be included in the memory device.

Examples

In one example, the is provided a memory structure comprising a memory cell and a first barrier layer having a maximum hydrogen diffusion coefficient of $1 \times 10^{-17}$ cm$^2$/s, said first barrier layer adjacent to the memory cell to minimize contaminant movement to or from the memory cell.

In one example of the memory structure, the memory cell includes a chalcogenide memory material.

In one example of the memory structure, the chalcogenide memory material comprises germanium, antimony, tellurium, silicon, nickel, gallium, arsenic, silver, tin, gold, lead, bismuth, indium, selenium, oxygen, sulphur, nitrogen, carbon, or a combination thereof.

In one example of the memory structure, the memory cell is a polarity-based memory cell.

In one example of the memory structure, the memory cell further comprises one or more electrodes.

In one example of the memory structure, the memory cell further comprises a select device material.

In one example of the memory structure, the first barrier layer is positioned on the memory cell.

In one example of the memory structure, the first barrier layer is positioned between a first passivation layer and the memory cell.

In one example of the memory structure, the first passivation layer is a polyimide passivation layer.

In one example of the memory structure, the first barrier layer is positioned between the first passivation layer and a tetraethyl orthosilicate (TEOS) layer.

In one example of the memory structure, the memory structure further comprises a second barrier layer having a maximum hydrogen diffusion coefficient of $1\times10^{-17}$ cm$^2$/s, said second barrier layer being positioned between the TEOS layer and the memory cell.

In one example of the memory structure, the TEOS layer is on the memory cell.

In one example of the memory structure, the memory cell is on the TEOS layer.

In one example of the memory structure, the first barrier layer is positioned between the first passivation layer and a second passivation layer.

In one example of the memory structure, the second passivation layer is an oxynitride passivation layer.

In one example of the memory structure, the memory structure further comprises a second barrier layer having a maximum hydrogen diffusion coefficient of $1\times10^{-17}$ cm$^2$/s, said second barrier layer being positioned between the first barrier layer and the memory cell.

In one example of the memory structure, the second barrier layer is positioned between the second passivation layer and a TEOS layer.

In one example of the memory structure, the memory structure further comprises a third barrier layer having a maximum hydrogen diffusion coefficient of $1\times10^{-17}$ cm$^2$/s, said third barrier layer being positioned between the TEOS layer and the memory cell.

In one example of the memory structure, the second barrier layer is positioned between a TEOS layer and the memory cell.

In one example of the memory structure, the memory structure further comprises a third barrier layer having a maximum hydrogen diffusion coefficient of $1\times10^{-17}$ cm$^2$/s, wherein the memory cell is positioned on the third barrier layer.

In one example of the memory structure, the memory cell is positioned on the first barrier layer.

In one example of the memory structure, the first barrier layer is positioned between the memory cell and a TEOS layer.

In one example of the memory structure, the first barrier layer has a thickness of from about 10 nm to about 300 nm.

In one example of the memory structure, the first barrier layer comprises silicon nitride, aluminum oxide, hafnium oxide, zirconium oxide, niobium oxide, titanium oxide, silicon carbide, or a combination thereof.

In one example, there is provided another memory structure comprising a memory cell, a first passivation layer adjacent the memory cell, a second passivation layer adjacent the memory cell, and a first barrier layer between the first passivation layer and the second passivation layer, said first barrier layer comprising a metal nitride, a metal oxide, a metal carbide, or a combination thereof.

In one example of the memory structure, the memory cell includes a chalcogenide memory material.

In one example of the memory structure, the chalcogenide memory material comprises germanium, antimony, tellurium, silicon, nickel, gallium, arsenic, silver, tin, gold, lead, bismuth, indium, selenium, oxygen, sulphur, nitrogen, carbon, or a combination thereof.

In one example of the memory structure, the memory cell is a polarity-based memory cell.

In one example of the memory structure, the memory cell further comprises one or more electrodes.

In one example of the memory structure, the memory cell further comprises a select device material.

In one example of the memory structure, the first passivation layer is a polyimide passivation layer.

In one example of the memory structure, the second passivation layer is an oxynitride passivation layer.

In one example of the memory structure, the first barrier layer comprises silicon nitride, aluminum oxide, hafnium oxide, zirconium oxide, niobium oxide, titanium oxide, silicon carbide, or a combination thereof.

In one example of the memory structure, the first barrier layer is positioned on the memory cell.

In one example of the memory structure, the memory structure further comprises a second barrier layer adjacent the memory cell, said second barrier layer comprising a metal nitride, a metal oxide, a metal carbide, or a combination thereof.

In one example of the memory structure, the second barrier layer is positioned between the second passivation layer and the memory cell.

In one example of the memory structure, the memory cell is positioned between the second barrier layer and the second passivation layer.

In one example of the memory structure, the memory structure further comprises a tetraethyl orthosilicate (TEOS) layer between the second passivation layer and the memory cell.

In one example of the memory structure, the second barrier layer is positioned between the second passivation layer and the TEOS layer.

In one example of the memory structure, further comprising a third barrier layer adjacent the memory cell, said third barrier layer comprising a metal nitride, a metal oxide, a metal carbide, or a combination thereof.

In one example of the memory structure, the third barrier layer is positioned between the TEOS layer and the memory cell.

In one example of the memory structure, the memory structure further comprises a fourth barrier layer positioned on a side of the memory cell opposite the third barrier layer, said fourth barrier layer comprising a metal nitride, a metal oxide, a metal carbide, or a combination thereof.

In one example of the memory structure, the third barrier layer is positioned on a side of the memory cell opposite the second barrier layer.

In one example of the memory structure, the second barrier layer is positioned between the TEOS layer and the memory cell.

In one example of the memory structure, the memory structure further comprises a third barrier layer positioned on a side of the memory cell opposite the second barrier layer, said third barrier layer comprising a metal nitride, a metal oxide, a metal carbide, or a combination thereof.

In one example of the memory structure, the first barrier layer has a thickness of from about 10 nanometer (nm) to about 300 nm.

In one example of the memory structure, the first barrier layer has a maximum hydrogen diffusion coefficient of $1\times10^{-17}$ cm$^2$/s.

In one example, there is provided a memory device comprising a plurality of memory cells and a first barrier layer having a maximum hydrogen diffusion coefficient of $1\times10^{-17}$ cm$^2$/s, said first barrier layer positioned adjacent to the plurality of memory cells to minimize contaminant movement to or from the plurality of memory cells.

In one example of the memory device, individual memory cells comprise a chalcogenide memory material.

In one example of the memory device, the chalcogenide memory material comprises germanium, antimony, tellurium, silicon, nickel, gallium, arsenic, silver, tin, gold, lead, bismuth, indium, selenium, oxygen, sulphur, nitrogen, carbon, or a combination thereof.

In one example of the memory device, individual memory cells are polarity-based memory cells.

In one example of the memory device, the plurality of memory cells is oriented along a conductive channel.

In one example of the memory device, individual memory cells comprise one or more electrodes.

In one example of the memory device, individual memory cells comprise a select device material.

In one example of the memory device, the first barrier layer is positioned on the memory cell.

In one example of the memory device, the first barrier layer is positioned between a first passivation layer and the memory cell.

In one example of the memory device, the first passivation layer is a polyimide passivation layer.

In one example of the memory device, the first barrier layer is positioned between the first passivation layer and a tetraethyl orthosilicate (TEOS) layer.

In one example of the memory device, the memory device further comprises a second barrier layer having a maximum hydrogen diffusion coefficient of $1\times10^{-17}$ cm$^2$/s, said second barrier layer being positioned between the TEOS layer and the memory cell.

In one example of the memory device, the TEOS layer is on the memory cell.

In one example of the memory device, the memory cell is on the TEOS layer.

In one example of the memory device, the first barrier layer is positioned between the first passivation layer and a second passivation layer.

In one example of the memory device, the second passivation layer is an oxynitride passivation layer.

In one example of the memory device, the memory device further comprises a second barrier layer having a maximum hydrogen diffusion coefficient of $1\times10^{-17}$ cm$^2$/s, said second barrier layer being positioned between the first barrier layer and the memory cell.

In one example of the memory device, the second barrier layer is positioned between the second passivation layer and a TEOS layer.

In one example of the memory device, the memory device further comprises a third barrier layer having a maximum hydrogen diffusion coefficient of $1\times10^{-17}$ cm$^2$/s, said third barrier layer being positioned between the TEOS layer and the memory cell.

In one example of the memory device, the second barrier layer is positioned between a TEOS layer and the memory cell.

In one example of the memory device, the memory device further comprises a third barrier layer having a maximum hydrogen diffusion coefficient of $1\times10^{-17}$ cm$^2$/s, wherein the memory cell is positioned on the third barrier layer.

In one example of the memory device, the memory cell is positioned on the first barrier layer.

In one example of the memory device, the first barrier layer is positioned between the memory cell and a TEOS layer.

In one example of the memory device, the first barrier layer has a thickness of from about 10 nm to about 300 nm.

In one example of the memory device, the first barrier layer comprises silicon nitride, aluminum oxide, hafnium oxide, zirconium oxide, niobium oxide, titanium oxide, silicon carbide, or a combination thereof.

In one example, there is provided a computing system comprising a motherboard and a memory device as described herein operatively coupled to the motherboard.

In one example of the computing system, the computing system comprises a desktop computer, a laptop computer, a tablet, a smartphone, a wearable device, a server, or a combination thereof.

In one example of the computing system, the computing system further comprises a processor, a memory device, a heat sink, a radio, a slot, a port, or a combination thereof operably coupled to the motherboard.

In one example, there is provided a method of prolonging write endurance comprising positioning a first barrier layer adjacent to a memory cell to minimize contaminant movement to or from the memory cell, said first barrier layer having a maximum hydrogen diffusion coefficient of $1\times10^{-17}$ cm$^2$/s.

In one example of the method of prolonging write endurance, the method comprises positioning the first barrier layer on the memory cell.

In one example of the method of prolonging write endurance, the method further comprises positioning the first barrier layer between a first passivation layer and the memory cell.

In one example of the method of prolonging write endurance, the method further comprises positioning the first barrier layer between the first passivation layer and a tetraethyl orthosilicate (TEOS) layer.

In one example of the method of prolonging write endurance, the method further comprises positioning a second barrier layer between the TEOS layer and the memory cell, said second barrier layer having a maximum hydrogen diffusion coefficient of $1\times10^{-17}$ cm$^2$/s.

In one example of the method of prolonging write endurance, the TEOS layer is on the memory cell.

In one example of the method of prolonging write endurance, the memory cell is on the TEOS layer.

In one example of the method of prolonging write endurance, the method further comprises positioning the first barrier layer between the first passivation layer and a second passivation layer.

In one example of the method of prolonging write endurance, the method further comprises positioning a second barrier layer between the first barrier layer and the memory cell, said second barrier layer having a maximum hydrogen diffusion coefficient of $1\times10^{-17}$ cm$^2$/s.

In one example of the method of prolonging write endurance, the method further comprises positioning the second barrier layer between the second passivation layer and a TEOS layer.

In one example of the method of prolonging write endurance, the method further comprises positioning a third barrier layer between the TEOS layer and the memory cell, said third barrier layer having a maximum hydrogen diffusion coefficient of $1 \times 10^{-17}$ cm$^2$/s.

In one example of the method of prolonging write endurance, the method further comprises positioning the second barrier layer between a TEOS layer and the memory cell.

In one example of the method of prolonging write endurance, the method further comprises positioning the memory cell on a third barrier layer having a maximum hydrogen diffusion coefficient of $1 \times 10^{-17}$ cm$^2$/s.

In one example of the method of prolonging write endurance, the method comprises positioning the memory cell on the first barrier layer.

In one example of the method of prolonging write endurance, the method further comprises positioning the first barrier layer between the memory cell and a TEOS layer.

In one example, there is provided a method of manufacturing a memory device comprising forming a plurality of memory cells and positioning a first barrier layer adjacent to the plurality of memory cells to minimize contaminant movement to or from the plurality of memory cells, said first barrier layer having a maximum hydrogen diffusion coefficient to of $1 \times 10^{-17}$ cm$^2$/s.

In one example of the method of manufacturing, the method comprises positioning the first barrier layer on the memory cell.

In one example of the method of manufacturing, the method further comprises positioning the first barrier layer between a first passivation layer and the memory cell.

In one example of the method of manufacturing, the method further comprises positioning the first barrier layer between the first passivation layer and a tetraethyl orthosilicate (TEOS) layer.

In one example of the method of manufacturing, the method further comprises positioning a second barrier layer between the TEOS layer and the memory cell, said second barrier layer having a maximum hydrogen diffusion coefficient of $1 \times 10^{-17}$ cm$^2$/s.

In one example of the method of manufacturing, the TEOS layer is on the memory cell.

In one example of the method of manufacturing, the memory cell is on the TEOS layer.

In one example of the method of manufacturing, the method further comprises positioning the first barrier layer between the first passivation layer and a second passivation layer.

In one example of the method of manufacturing, the method further comprises positioning a second barrier layer between the first barrier layer and the memory cell, said second barrier layer having a maximum hydrogen diffusion coefficient of $1 \times 10^{-17}$ cm$^2$/s.

In one example of the method of manufacturing, the method further comprises positioning the second barrier layer between the second passivation layer and a TEOS layer.

In one example of the method of manufacturing, the method further comprises positioning a third barrier layer between the TEOS layer and the memory cell, said third barrier layer having a maximum hydrogen diffusion coefficient of $1 \times 10^{-17}$ cm$^2$/s.

In one example of the method of manufacturing, the method further comprises positioning the second barrier layer between a TEOS layer and the memory cell.

In one example of the method of manufacturing, the method further comprises positioning the memory cell on a third barrier layer having a maximum hydrogen diffusion coefficient of $1 \times 10^{-17}$ cm$^2$/s.

In one example of the method of manufacturing, the method comprises positioning the memory cell on the first barrier layer.

In one example of the method of manufacturing, the method further comprises positioning the first barrier layer between the memory cell and a TEOS layer.

While the forgoing examples are illustrative of the principles of technology embodiments in one or more particular applications, it will be apparent to those of ordinary skill in the art that numerous modifications in form, usage and details of implementation can be made without the exercise of inventive faculty, and without departing from the principles and concepts of the disclosure.

What is claimed is:

1. A memory structure, comprising:
a memory cell;
a conductive channel coupled with the memory cell;
a first passivation layer over the conductive channel;
a second passivation layer between the conductive channel and the first passivation layer;
a tetraethyl orthosilicate (TEOS) layer between the conductive channel and the second passivation layer; and
a first barrier layer between the first passivation layer and the second passivation layer, the first barrier layer comprising one or more of: silicon nitride, a metal nitride, a metal oxide, and a metal carbide.

2. The memory structure of claim 1, wherein:
the conductive channel comprises a wordline or a bitline.

3. The memory structure of claim 1, further comprising:
an electrode between a memory element of the memory cell and the conductive channel.

4. The memory structure of claim 1, wherein:
the memory cell includes a memory element including a phase change material and/or chalcogenide material.

5. The memory structure of claim 4, wherein:
the chalcogenide material includes one or more of: germanium, antimony, tellurium, silicon, nickel, gallium, arsenic, silver, tin, gold, lead, bismuth, indium, selenium, oxygen, sulfur, nitrogen, and carbon.

6. The memory structure of claim 1, wherein:
the first barrier layer includes a dopant including one or more: silicon, zirconium, hafnium, niobium, titanium, and carbon.

7. The memory structure of claim 1, further comprising:
a second barrier layer between the conductive channel and the second passivation layer.

8. The memory structure of claim 7, further comprising:
a tetraethyl orthosilicate (TEOS) layer between the conductive channel and the second barrier layer.

9. The memory structure of claim 8, further comprising:
a third barrier layer between the TEOS layer and the conductive channel.

10. The memory structure of claim 7, further comprising:
a tetraethyl orthosilicate (TEOS) layer between the second barrier layer and the second passivation layer.

11. The memory structure of claim 1, further comprising:
a second conductive channel coupled with the memory cell; and
a second barrier layer between the second conductive channel and a second tetraethyl orthosilicate (TEOS) layer.

12. The memory structure of claim 1, wherein:
the first barrier layer has a thickness of from about 10 nanometer (nm) to about 300 nm.

13. The memory structure of claim 1, wherein:
the first barrier layer includes a maximum hydrogen diffusion coefficient of $1 \times 10^{-17}$ cm$^2$/s.

14. A memory structure, comprising:
 a memory cell;
 a conductive channel coupled with the memory cell;
 a first passivation layer over the conductive channel;
 a tetraethyl orthosilicate (TEOS) layer between the conductive channel and the first passivation layer; and
 a first barrier layer between the first passivation layer and the TEOS layer, the first barrier layer comprising one or more of: silicon nitride, a metal nitride, a metal oxide, and a metal carbide.

15. The memory structure of claim 14, wherein:
 the conductive channel comprises a wordline or a bitline.

16. The memory structure of claim 14, wherein:
 the memory cell includes a memory element including a phase change material and/or chalcogenide material.

17. A memory structure, comprising:
 a memory cell including a non-volatile memory element, the non-volatile memory element including a chalcogenide material and/or a phase change material;
 a conductive channel coupled with the memory cell;
 a first passivation layer adjacent to the conductive channel;
 a first barrier layer between the first passivation layer and the conductive channel, the first barrier layer including one or more of: silicon nitride, a metal nitride, a metal oxide, and a metal carbide; and
 a tetraethyl orthosilicate (TEOS) layer between the conductive channel and the first barrier layer.

18. The memory structure of claim 17, wherein:
 the conductive channel comprises a wordline or a bitline.

* * * * *